United States Patent
Yang et al.

(10) Patent No.: US 8,565,023 B2
(45) Date of Patent: Oct. 22, 2013

(54) CONCURRENT OPERATION OF PLURAL FLASH MEMORIES

(71) Applicant: Taiwan Semiconductor Manufacturing Co., Ltd., Hsin-Chu (TW)

(72) Inventors: Tien-Chun Yang, San Jose, CA (US); Chia-Fu Lee, Hsinchu (TW); Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/670,607

(22) Filed: Nov. 7, 2012

(65) Prior Publication Data

US 2013/0064017 A1    Mar. 14, 2013

Related U.S. Application Data (63) Continuation of application No. 12/979,425, filed on Dec. 28, 2010, now Pat. No. 8,325,534.

(51) Int. Cl.
*G11C 16/04* (2006.01)

(52) U.S. Cl.
USPC ............. 365/185.18; 365/230.02; 365/189.02

(58) Field of Classification Search
USPC ............................ 365/185.18, 230.02, 189.02
See application file for complete search history.

(56) References Cited

U.S. PATENT DOCUMENTS

| | | | |
|---|---|---|---|
| 5,263,003 A | 11/1993 | Cowles et al. | |
| 6,275,412 B1 * | 8/2001 | Kasa et al. | 365/185.01 |
| 6,456,526 B2 | 9/2002 | Tsujikawa et al. | |
| 6,550,028 B1 * | 4/2003 | Akaogi et al. | 365/201 |
| 7,719,897 B2 * | 5/2010 | Lee et al. | 365/185.22 |
| 2005/0281113 A1 | 12/2005 | Yada et al. | |
| 2009/0190401 A1 | 7/2009 | Jeon et al. | |

* cited by examiner

*Primary Examiner* — Tuan T. Nguyen
(74) *Attorney, Agent, or Firm* — Duane Morris LLP; Steven E. Koffs (57) ABSTRACT

A device comprises an address storage device. A first circuit includes a first flash memory, configured to sequentially receive first and second addresses and store the first address in the address storage device. The first circuit has a first set of control inputs for causing the first circuit to perform a first operation from the group consisting of read, program and erase on a cell of the first flash memory corresponding to a selected one of the first and second addresses. A second circuit includes a second flash memory, configured to receive the second address. The second circuit has a second set of control inputs for causing the second circuit to read data from a cell of the second flash memory corresponding to the second address while the first operation is being performed.

20 Claims, 11 Drawing Sheets

| CKTA Flash IP with CP | CKTB Flash IP w/o CP | CIRCUIT A | | | | | | CIRCUIT B | | | | | |
|---|---|---|---|---|---|---|---|---|---|---|---|---|---|
| | | XEA | YEA | SEA | PROGA | ERASEA | NVSTRA | XEB | YEB | SEB | PROGB | ERASEB | NVSTRB |
| Standby | Standby | L | L | L | L | L | L | L | L | L | L | L | L |
| Read | NOP | H | H | H | L | L | L | L | L | L | L | L | L |
| Program | NOP | H | H | L | H | L | H | L | L | L | L | L | L |
| Erase | NOP | H | L | L | L | H | H | L | L | L | L | L | L |
| NOP | Read | L | L | L | L | L | L | H | H | H | L | L | L |
| NOP | Program | L | L | L | H | L | L | H | H | L | H | L | H |
| NOP | Erase | L | L | L | L | H | L | H | L | L | L | H | H |
| Read | Read | H | H | H | L | L | L | H | H | H | L | L | L |
| Program | Read* | H | H | L | H | L | H | H | H | H | L | L | L |
| Erase | Read* | H | H | L | L | H | H | H | H | H | L | L | L |
| Read | Program | not used | | | | | | | | | | | |
| Read | Erase | not used | | | | | | | | | | | |

* Program (same for erase) operation is applied on one flash IP at the same time.

CONCURRENT OPERATION OF PLURAL FLASH MEMORIES

This application is a continuation of U.S. patent application Ser. No. 12/979,425, filed Dec. 28, 2010, which is incorporated by reference herein in its entirety.

FIELD

The present disclosure relates to semiconductor integrated circuits having embedded flash memory.

BACKGROUND

Flash memory is a non-volatile storage medium, and is a type of electrically erasable programmable read only memory (EEPROM) that can be programmed and erased in large blocks. Flash memories are often used as mass storage devices, such as memory cards, USB flash drives, and MP3 players. Additionally, embedded flash memory is incorporated into an increasing variety of devices. Example applications include smart phones, PDAs (personal digital assistants), computers, digital audio players, digital cameras, mobile phones and console video game hardware, and many others.

Nearly all flash memory integrated circuits include integrated charge pumps. Flash memory uses a high voltage pulse to wipe out any existing data in a particular memory cell before it is written with a new value. Although it is possible to include separate power supplies: (e.g., +5V for reading and +12 V for erasing), more commonly, the higher voltage, used to erase cells, is generated internally by an on-chip charge pump. It is thus possible to provide both voltage levels from one external power supply—(e.g., 1.8 or 3.3V).

However, the charge pump occupies a large are in the integrated circuit (IC). In some cases, the charge pump occupies about 20% of the footprint of the IC.

Methods of facilitating increased use of embedded flash memories are desired.

DETAILED DESCRIPTION

This description of the exemplary embodiments is intended to be read in connection with the accompanying drawings, which are to be considered part of the entire written description.

FIGS. 1A, 2A and 4-6 are schematic diagrams of a device comprising: an address storage device 118, a first circuit 104 having a first embedded flash memory 105, and a second circuit 106 having a second embedded flash memory 107. The first circuit 104 and second circuit 106 are configured for operating concurrently on separate data streams. In various embodiments, the first and second circuits 104, 106 share a common charge pump 109 and/or at least one common input address pin (e.g., XADR[9] to XADR[0] and YADR[4] to YADR[0]).

The first circuit 104 and the second circuit 106 may each be a system on a chip, a digital signal processor, a test circuit, or any of a variety of application specific integrated circuit products. In some embodiments, one or both of the circuits 104 and 106 are made according to application specific designs (also referred to as Intellectual Property, or IP) made by a fabless design provider, either for test purposes or for sale as, or within, a commercial product. In other embodiments, one or both of the circuits 104 and 106 are made according to designs (IP) in an IP library of a semiconductor IC foundry, either for test purposes or for reuse by customers of the foundry.

Figure 6:
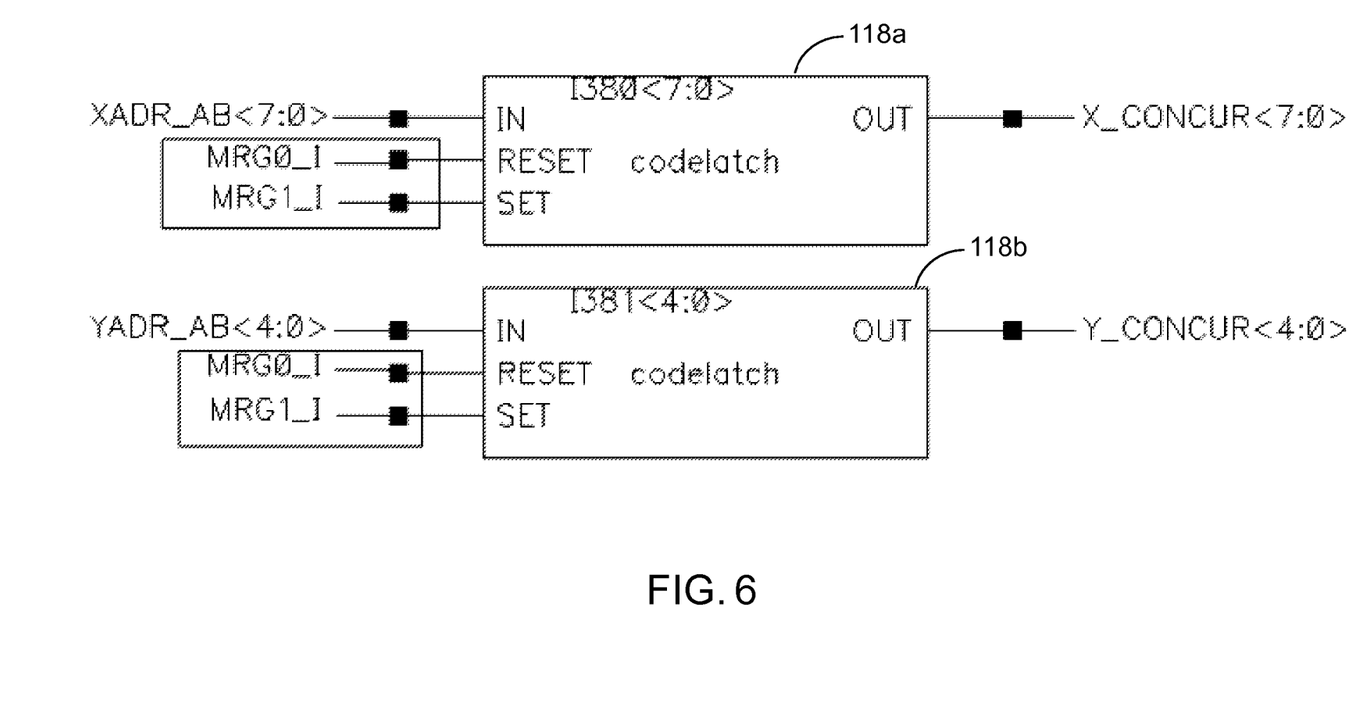
FIG. 6 is a schematic diagram of latches included in the circuit A of FIG. 4.

The address storage device 118 may be any of a variety of storage devices, such as a latch, a clocked flip-flop or a register. In some embodiments, a plurality of storage devices 118a, 118b are provided to store two addresses at a time, or a single address having plural portions (e.g., most significant bits and least significant bits, or page and offset portions). For example, FIG. 6 shows two latches: a first latch 118a that stores 8 bits of an X address, and a second latch 118b that stores 5 bits of a Y address. Because the storage devices 118a, 118b can either store different addresses or different parts of a single address, they can have different sizes from each other.

Figure 1A:
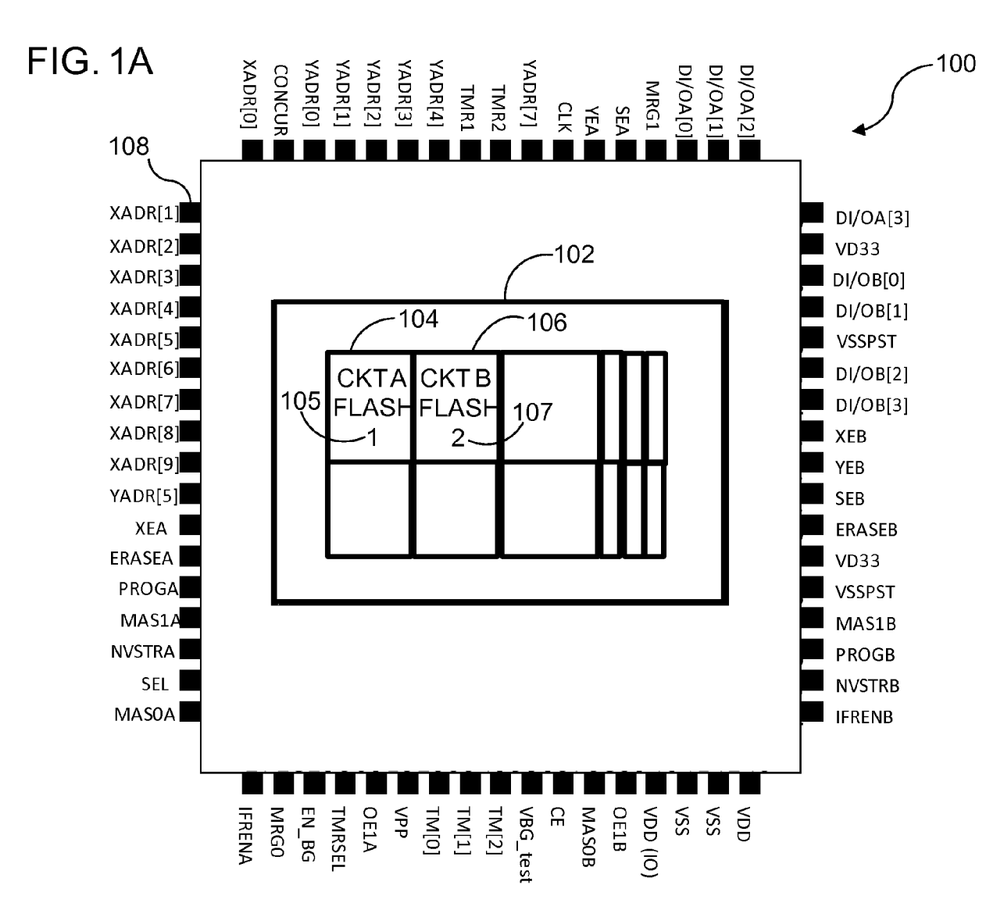
FIG. 1A is a schematic diagram of an integrated circuit package including two circuits in a single integrated circuit die.
Figure 5:
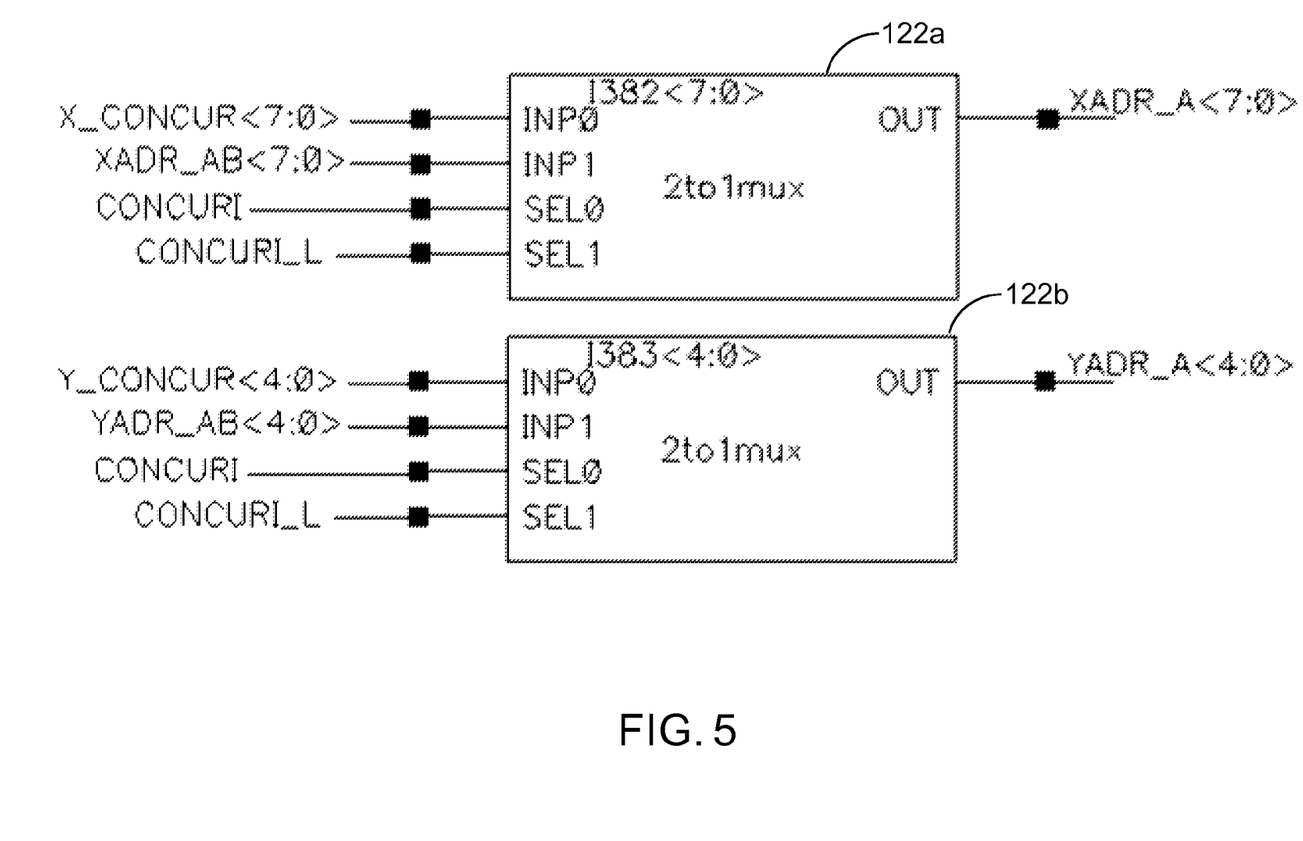
FIG. 5 is a schematic diagram of multiplexers included in the circuit A of FIG. 4.
Figure 7:
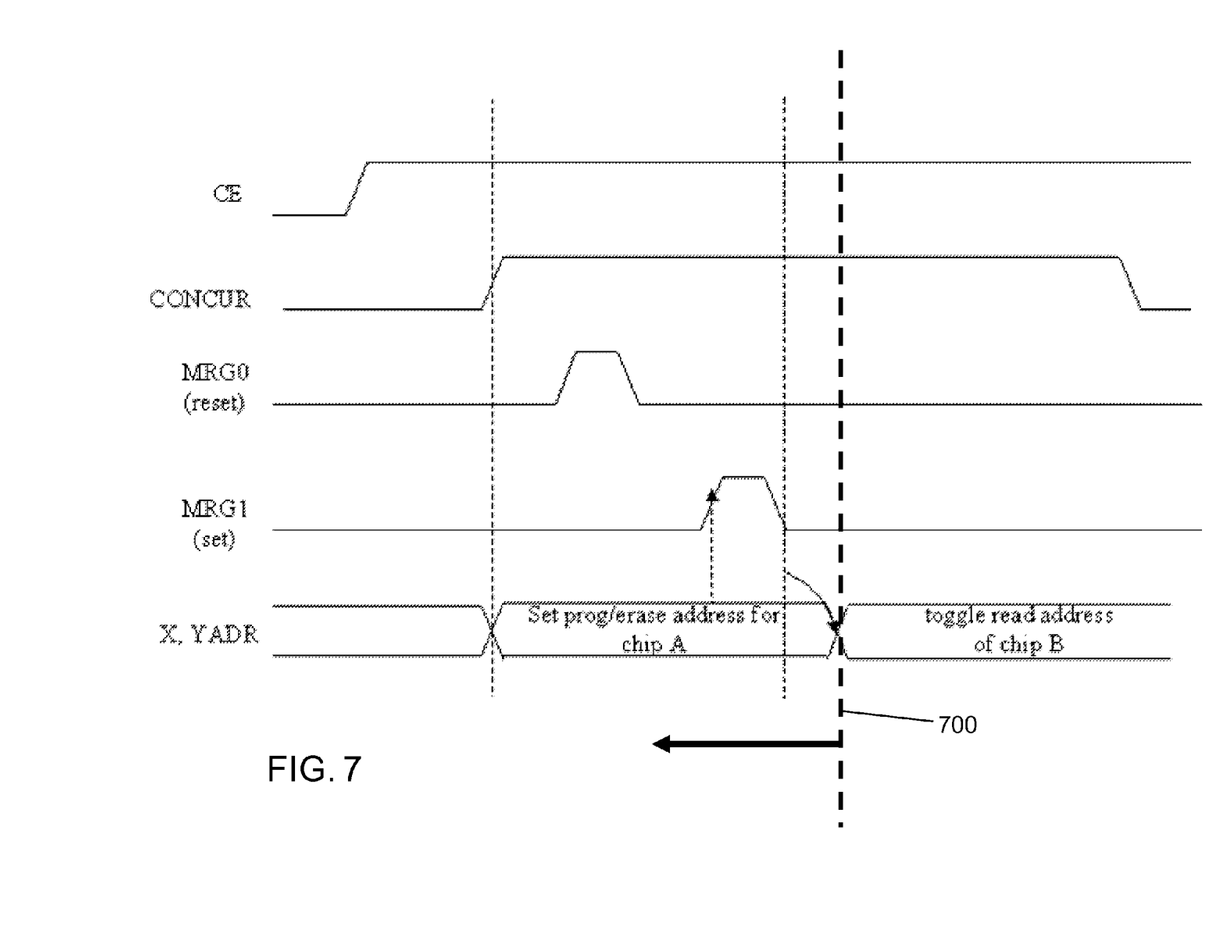
FIGS. 7-9 are timing diagrams for a program/erase operation in one circuit of FIG. 4 concurrently with a read operation in the other circuit of FIG. 4.

The address storage devices 118a, 118b are connected to the address input pins XADR[9] to XADR[0] and YADR[4] to YADR[0] as shown in FIG. 1. The inputs to the latches 118a, 118b are represented in FIGS. 5-7 by XADR_AB<7:0> and YADR_AB<4:0>. In some embodiments, the latches 118a, 118b are simple SR NOR latches, or SR NAND latches, for example, but other types of latches or storage elements may be used. Each latch has a set and a reset pin, one, both or neither of which can be asserted in combinations, so the latch 118a, 118b replaces its content with the current input address provided to the input pins XADR[9] to XADR[0] and YADR[4] to YADR[0] of the integrated circuit. Then the set and reset pin are then controlled so each latch keeps the stored value, while the externally supplied address input may continue to change.

The flash memories 105 and 107 use a high voltage pulse to erase any existing data in a particular memory cell before it can be programmed with a new value. A charge pump 109 is used to internally generate the higher voltage used for erasing cells, without the need for a separate high voltage power supply. In the example of FIGS. 1A, 2A and 4-6, although both circuits 104 and 106 include flash memories 105, 107, respectively, only one of the circuits (circuit 104) has a charge pump 109, which serves both circuits 104, 106. In other embodiments (not shown), each circuit has its own charge pump.

The first circuit 104 is configured to sequentially receive addresses XADR_AB<7:0> and YADR_AB<4:0> from the external pins XADR[9] to XADR[0] and YADR[4] to YADR[0] of the IC package 100. In the examples below, a first and a second address are discussed. It will be understood that the first and second addresses may be any two consecutive or non-consecutive addresses in a longer sequence of addresses that are initially received from the same set of external pins. In the example, XADR_AB<7:0> and YADR_AB<4:0> may be considered a first address, either corresponding to two address portions (X and Y) of a single address, or to one pair of data elements (X and Y) of an input data vector.

The first circuit includes conductive paths to provide the address input signal to the IN (input) terminals of the latches 118a, 118b. Using the set and reset pins of the latches 118a, 118b, the first address XADR_AB<7:0> and YADR_AB<4:0> is stored in the address storage device. The set and reset pins of the latches 118a, 118b are controlled by applying appropriate voltage levels to the external MRG0 and MRG1 input pins shown in FIG. 1A. Thus, an external circuit or program determines and controls when to save the current address from the external pins XADR[9] to XADR[0] and YADR[4] to YADR[0] into the latches 118a, 118b (and stop replacing the address in the latches).

FIG. 5 shows a pair of 2 to 1 multiplexers (muxes) 122a, 122b within the first circuit 104. Each mux 122a, 122b has a pair of data inputs, INP0 and INP1. In mux 122a, INP0 is connected to receive the output (X_CONCUR<7:0>) of latch 118a and INP1 is connected to the input pins XADR[7] to XADR[0]. In mux 122b, INP0 is connected to the output (Y_CONCUR<4:0>) of latch 118b and INP1 is connected to the input pins YADR[4] to YADR[0]. Muxes 122a and 122b also have two control terminals SEL0 and SEL1 connected to receive the selection of outputs.

In many (or most) cases, the concurrent operations of the circuits 104 and 106 are independent of each other, so that circuits 104 and 106 access memory cells having respectively different addresses in the first flash memory 105 and the second flash memory 107. To allow the two circuits 104 and 106 to share a single set of address input pins (shown in FIG. 1A) but access memory cells at different addresses concurrently, the SEL0 terminal of the muxes 122a and 122b are asserted. This causes muxes 122a and 122b to output the latch contents X_CONCUR<7:0>, Y_CONCUR<4:0> (i.e., the first address) at the output terminals XADR_A<7:0> and YADR_A<4:0>, respectively. Thus, the first circuit 104 performs an operation on the memory cells in flash memory 105 corresponding to the addresses X_CONCUR<7:0>, Y_CONCUR <4:0> retrieved from the latches 118a, 118b. The second circuit 106 can perform a read of data stored at an address of the second flash memory 107 corresponding to the address currently received at the input pins, concurrently while the program or erase operation is performed in the first flash memory 105. Thus, by sharing at least one address input pint, the total number of input pins in the IC can be reduced.

In the case where both circuits 104 and 106 are accessing data at the same addresses in their respective flash memories 105, 107 the SEL1 terminal of the muxes 122a and 122b are asserted. This causes muxes 122a and 122b to output the input signals currently received by input pins XADR[7:0], YADR [4:0] at the output terminals XADR_A<7:0> and YADR_A<4:0>, respectively. Thus, the first circuit 104 performs an operation on the memory cells in flash memory 105 corresponding to the addresses XADR_AB<7:0>, YADR_AB<4:0> (i.e., the second address) received from the common external input pins XADR[7:0], YADR[4:0] of the IC package 100. This is the same address that is concurrently read by the second circuit 106 from the second flash memory 107.

An external circuit or process determines whether to select the latched address or the current address for the first circuit, and provides the input to the SEL external input pin of the IC package (shown in FIG. 1A). The determination of whether to assert the SEL0 terminal (first flash 105 accesses address in latches 118a, 118b) or to assert the SEL1 terminal (first flash 105 accesses address from external input pins) can be made by comparing the addresses to be accessed next by the first and second circuits 104, 106. If the addresses are different, the SEL0 terminal of muxes 122a, 122b is asserted. If the addresses are the same, the SEL1 terminal of muxes 122a, 122b is asserted.

Figure 4:
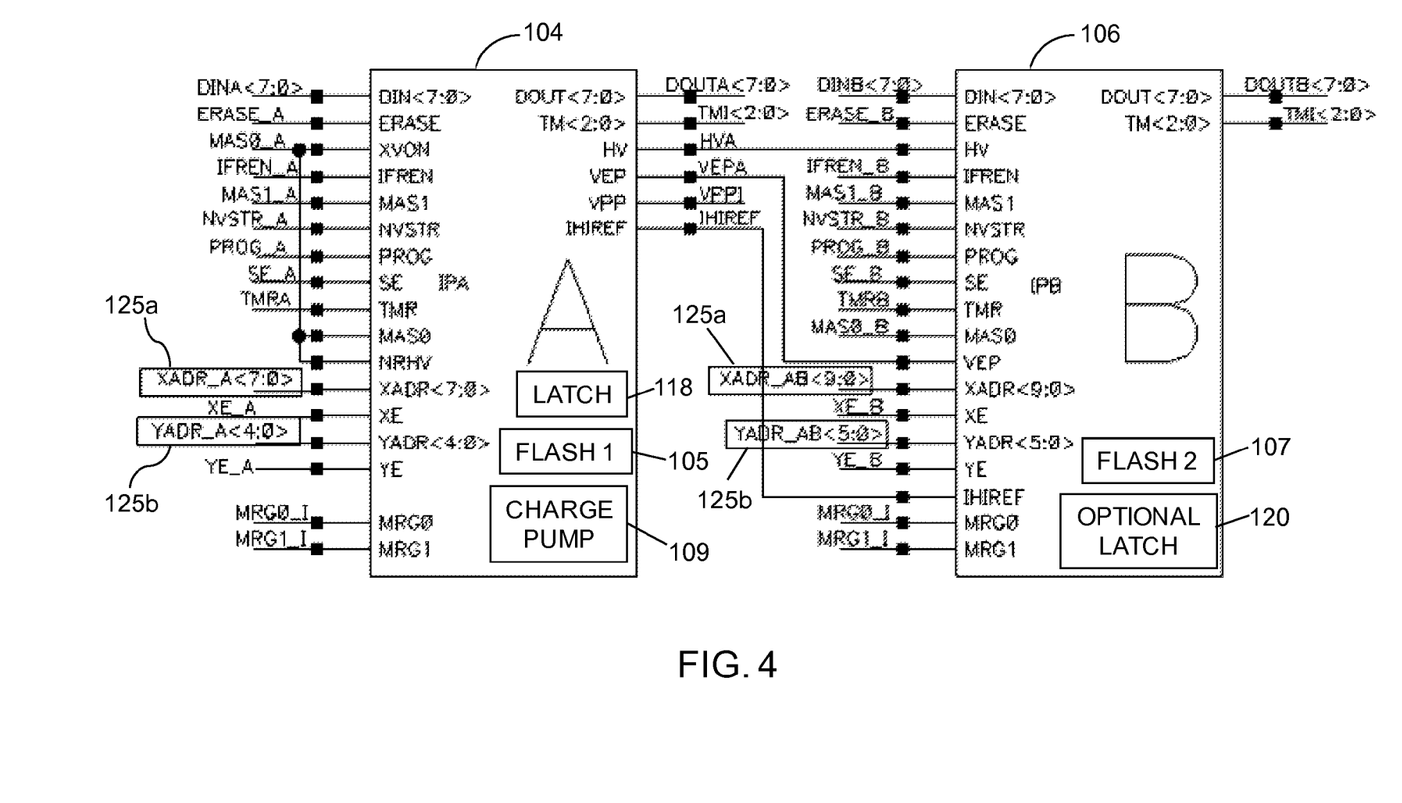
FIG. 4 is a schematic diagram of the circuits shown in FIGS. 1A or 1B.

At any given time, address XADR_AB<7:0> and YADR_AB<4:0> is also provided from the external input pins XADR[0] to XADR[9] and YADR[0] to YADR[4] to the second circuit 106. In FIG. 4, both sets of address inputs XADR_A<7:0> and YADR_A<4:0> provided to the first circuit and XADR_AB<9:0> and YADR_AB<5:0> provided to the second circuit 106 are connected to the common set of external input pins XADR[0] to XADR[9] and YADR[0] to YADR[4]. These terminals connected to the shared address input pins are indicated by shared reference numerals 125a, 125b. An example is described in which a first address XADR_AB<7:0> and YADR_AB<4:0> from the external input pins XADR[0] to XADR[9] and YADR[0] to YADR[4] is stored in the latches 118a, 118b, and then a second address XADR_AB<7:0> and YADR_AB<4:0> different from the first address is subsequently received from the external input pins XADR[0] to XADR[9] and YADR[0] to YADR[4] in another clock cycle.

The first circuit 104 has a first set of control inputs for causing the first circuit to perform a first operation from the group consisting of read, program and erase on a cell of the first flash memory 105 corresponding to a selected one of the first and second addresses. In FIG. 4, all of the inputs to first circuit 104 except the data input DINA<7:0>, XADR_A<7:0> and YADR<7:0> are control inputs. The number and function of control inputs depends on the particular application performed by the circuit 104.

Similarly, the second circuit 106 is configured to receive the second address. The second circuit 106 has a second set of control inputs for causing the second circuit to perform a read operation from the cell of the second flash memory 107 corresponding to a the second address while the first operation is being performed in the first flash memory 105. In FIG. 4, all of the inputs to second circuit 106 except the data input DINB<7:0>, XADR_AB<9:0> and YADR_AB<5:0>, HVA, VEPA and IHIREF are control inputs.

The number and function of control inputs for each of the circuits 104 and 106 depends on the particular application performed by the circuits. The control inputs for circuits 104 and 106 are discussed below with reference to FIGS. 2A, 2B and 3.

Figure 2A:
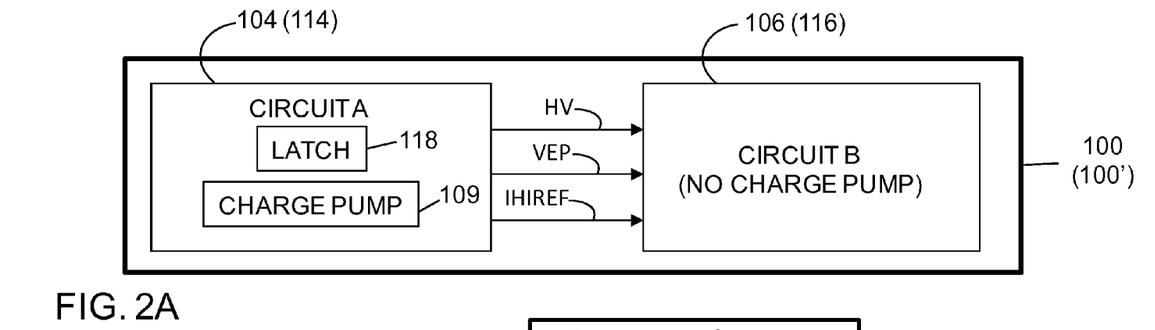
FIG. 2A shows the two circuits of FIG. 1A or 1B.
Figure 2B:
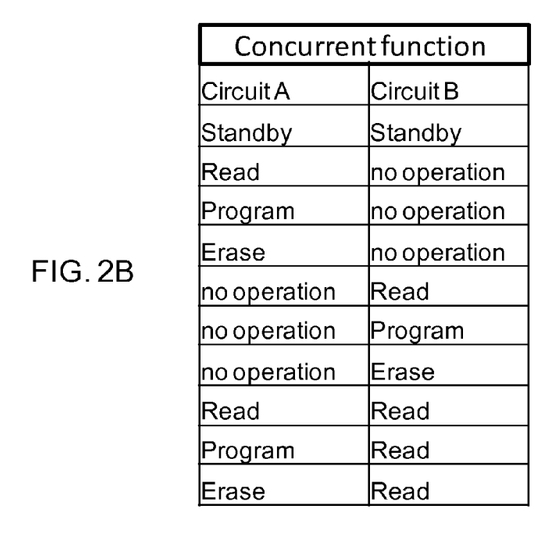
FIG. 2B is a table of operations performed concurrently in the circuits of FIG. 2A.

FIGS. 2A and 2B show the device 100 including the first circuit 104 and second circuit 106, where the first circuit is equipped with at least one address storage device (latch) 118. FIG. 2A shows three conductive paths, including a first conductive path VEP for providing an erase voltage or a program voltage from the first circuit to the second circuit, a second conductive path IHIREF for providing a high reference current from the first circuit to the second circuit, and a third conductive path HV for the high voltage level provided by the charge pump. Except for the shared address inputs and the three paths HV, VEP and IHIREF, the other inputs and outputs of the first circuit 104 and second circuit 106 are independent of each other.

FIG. 2B summarizes the various combinations of operations that may be performed for accessing either or both of the flash memories 105, 107 at any given time. As indicated by the first seven rows, each circuit 104, 106 is capable of reading, erasing or programming its respective flash memory 105, 107 while the other of the two circuits is not accessing the other of the two flash memories. In addition, as shown in the next three rows of FIG. 2B, the second circuit 106 can read from the a cell of the second flash memory 107 while any one of the group selected from a read, erase or program operation is being performed by the first circuit 104 accessing the first flash memory 105.

As indicated by FIG. 2B, only one of the two circuits 104, 106 is erased or programmed at any given time. Since the voltage of charge pump 109 is load dependent, higher loads result in lower average charge pump output voltages. Thus, to ensure a sufficiently high erase/program voltage without further increase in the size of the shared charge pump 109, only one of the two circuits is erased/programmed at any given time Also, FIG. 2A shows that the circuit 104 having the address storage device 118 also has a charge pump 109, and the second circuit 106 does not have a separate charge pump for its flash memory 107. In this example, the circuit 104 can be reused advantageously in combination with various other second circuits that do not have their own address storage device 118 or charge pump 109. This allows reduction of the chip area (footprint) of the second circuit 106, and simplifies the design of the second circuit. If the first circuit 104 is included in the IP library of a semiconductor foundry, the foundry can offer the IP design of the first circuit 104 to its customers, and the customers do not need to provide their own charge pump for inclusion in the design of the second circuit 106.

However, in other embodiments (not shown), the address storage device 118 is included in the first circuit 104 and the charge pump is included in the second circuit 106 (in which case the voltages HV and VEP and the current IHIREF flow from circuit 106 to circuit 104).

Figure 3:
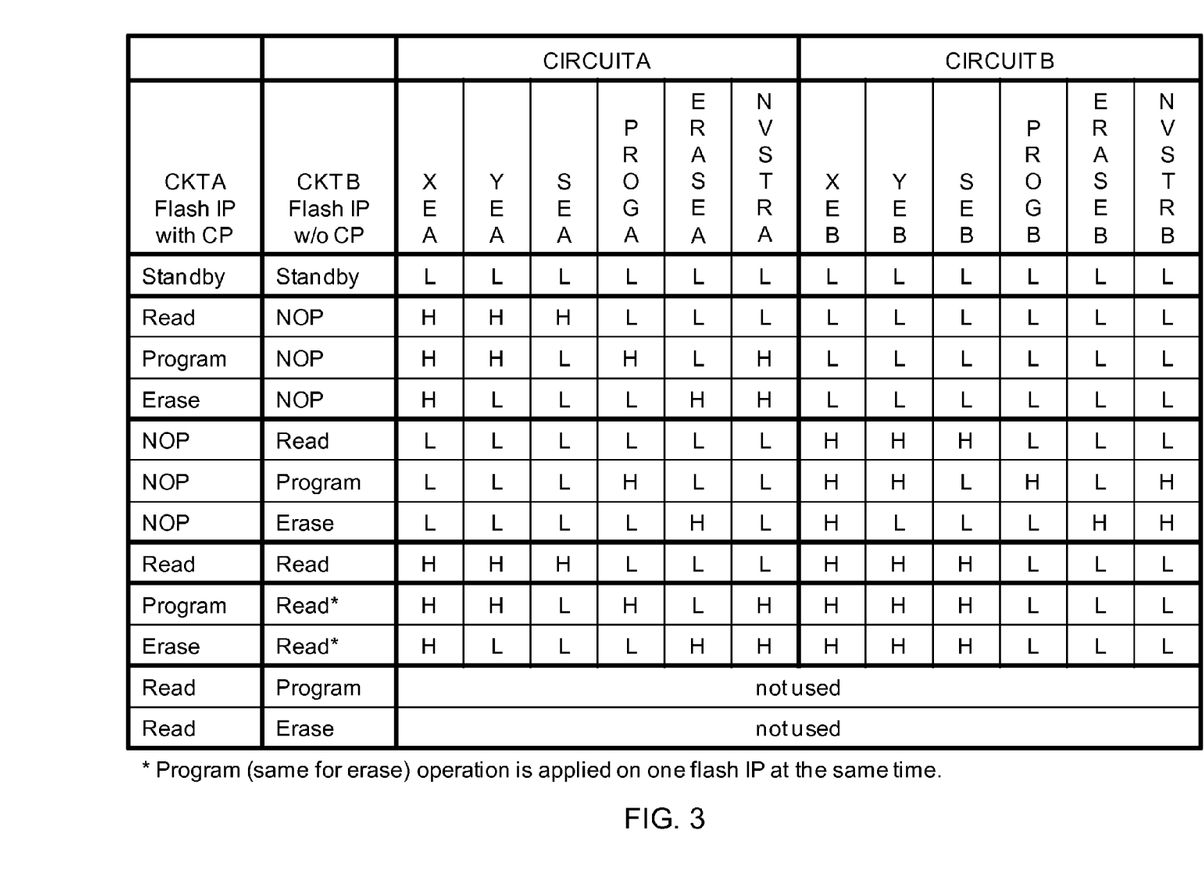
FIG. 3 is a table of the signal values for the various operations shown in FIG. 2B.

FIG. 3 is a detailed table showing the various combinations of low (L) and high (H) control signals applied to the various control inputs for each combination of zero, one or two concurrent operations.

Figure 1B:
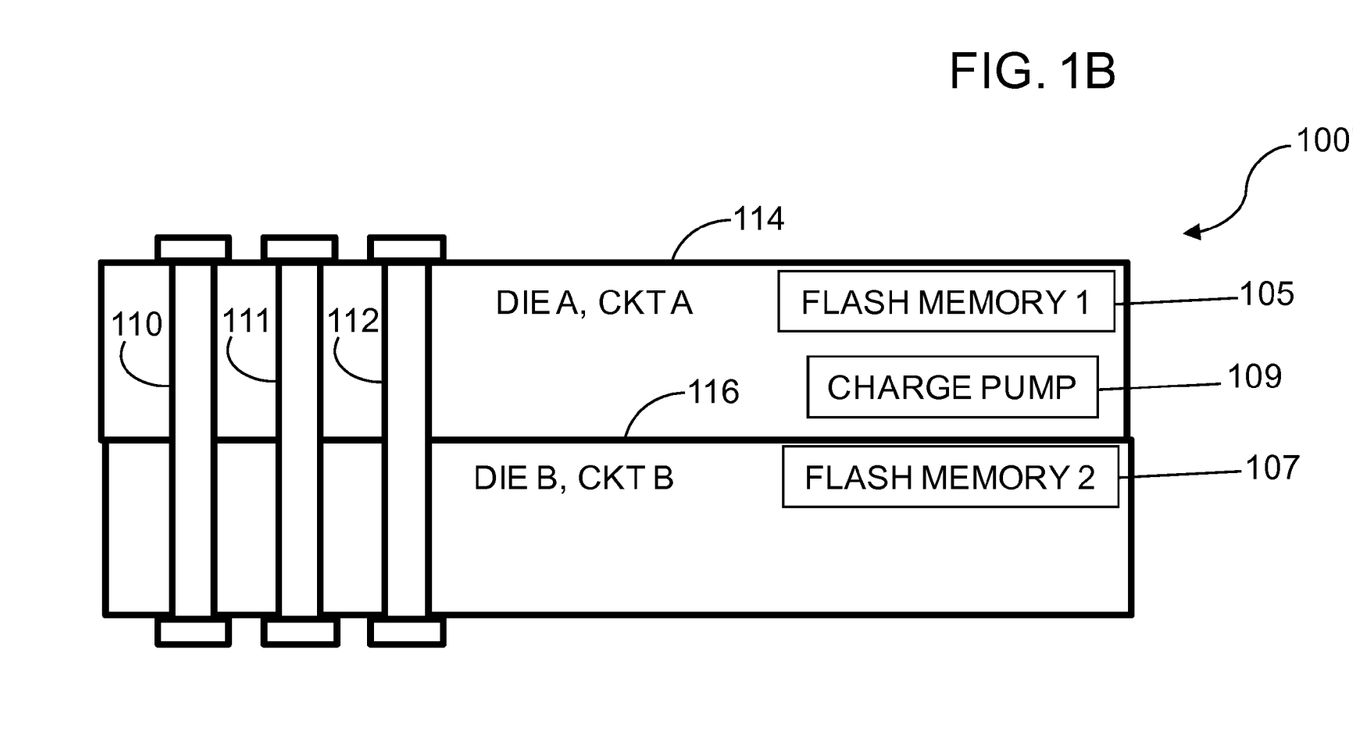
FIG. 1B is a schematic diagram of a three dimensional integrated circuit (3DIC) package including two circuits in two different integrated circuit dies.

Although FIG. 1A shows an example in which the first and second circuits 104, 106 are formed on a single integrated circuit chip, this is optional. For example, FIG. 1B shows an alternative packaging configuration in which each of the circuits is formed on a respective separate die 114, 116. In FIG. 1B, the dies 114, 116 are incorporated into a single three dimensional integrated circuit package 100'. The connections between the dies may be made, for example, using though-substrate-vias (also referred to as though-silicon-vias, or TSVs) 110-112. For example, the signals HV, VEP and IHIREF may be transmitted from the die having the charge pump to the die without a charge pump by TSVs 110-112. Additional TSVs (not shown in FIG. 1B) transmit any other control signals between dies, as may be appropriate for any given application.

Figure 8:
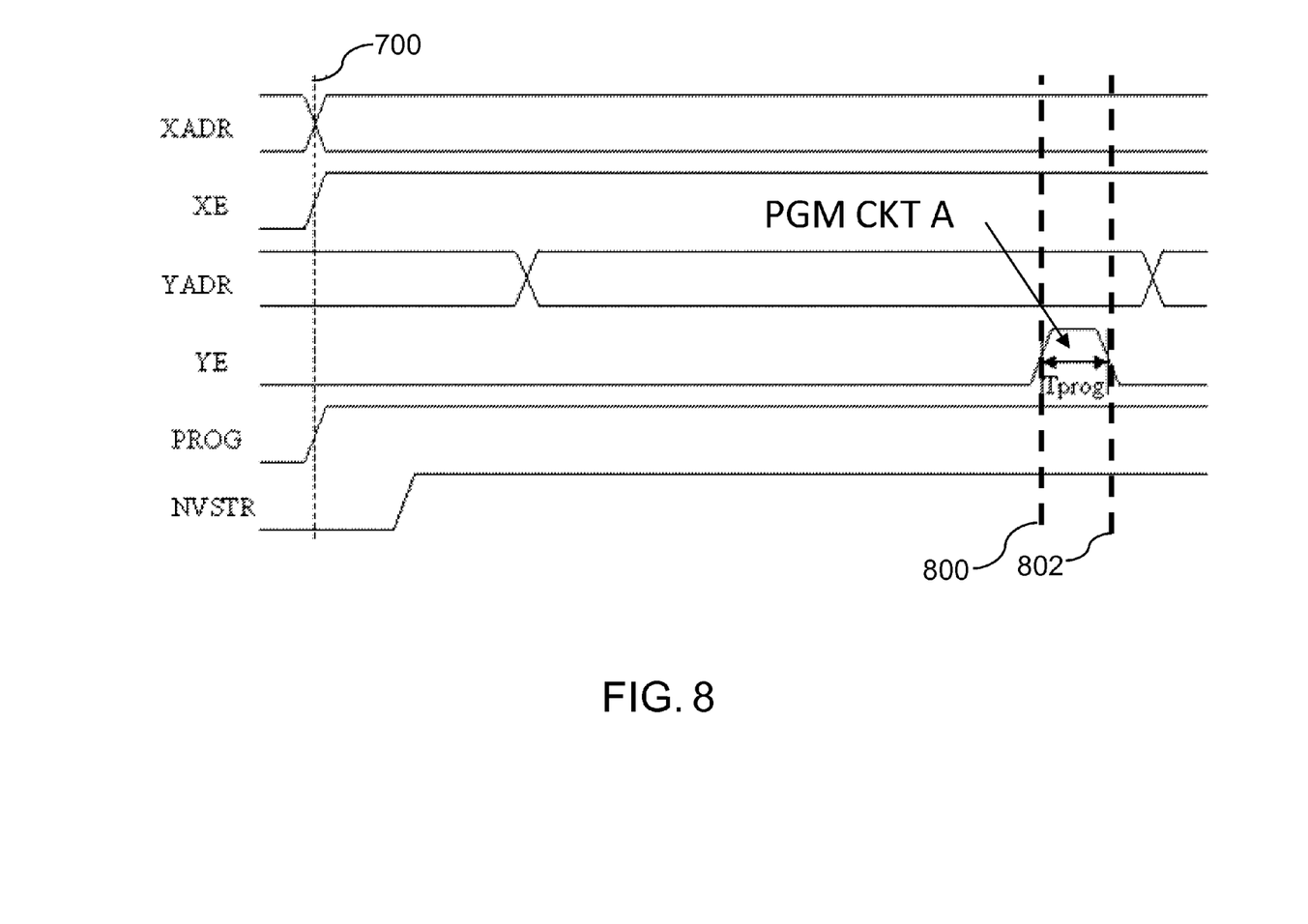
Figure 9:
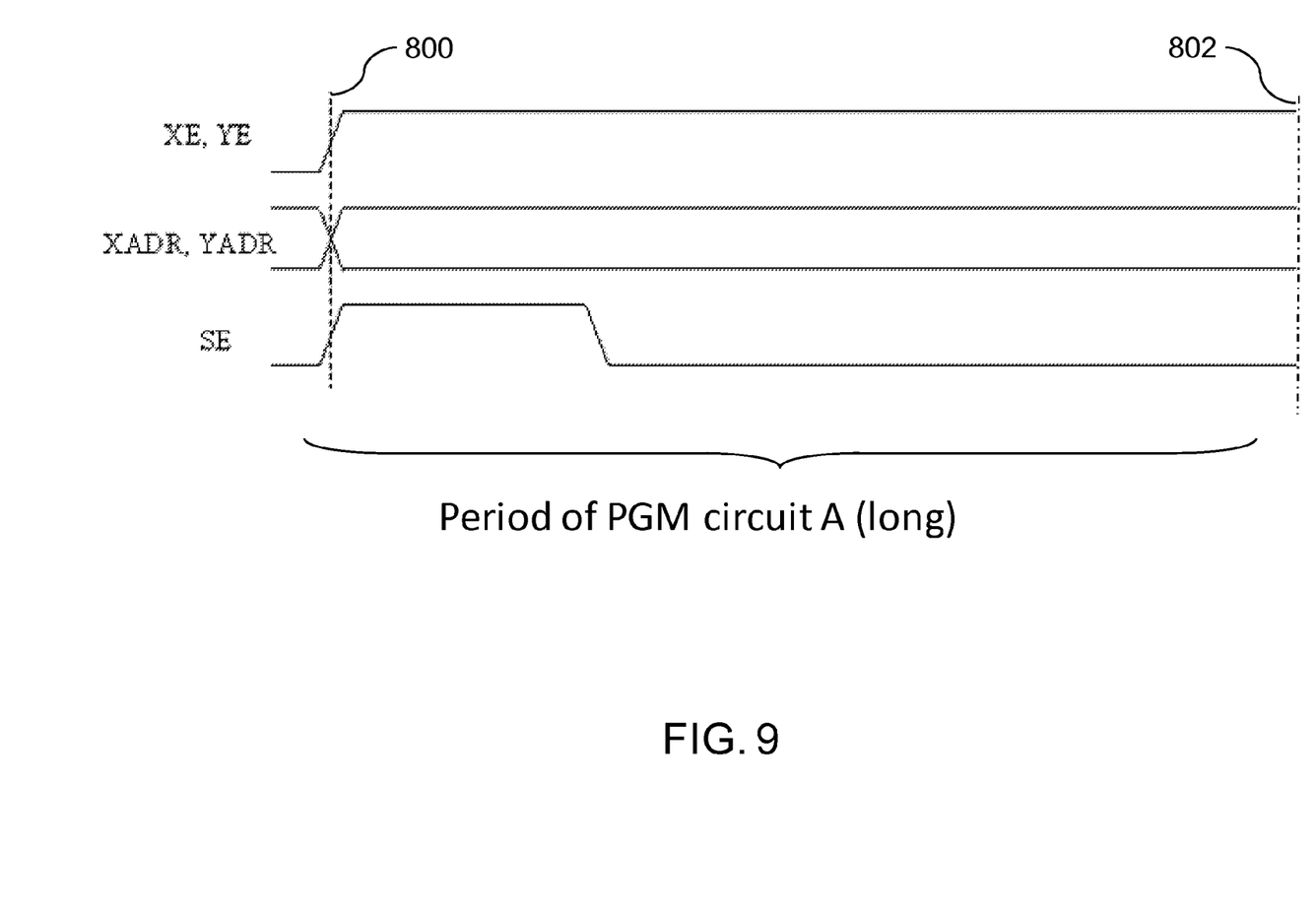

FIGS. 7-9 are timing diagrams showing the operations of the two circuits 104, 106.

In FIG. 7, a set of operations is begun with the transition of the chip enable signal CE (applied by an external circuit to the CE input pin of the IC package 100, as shown in FIG. 1A).

Next, when the signal is applied to the CONCUR input pin of the IC package 100, the signals applied to the MRG0 and MRG1 pins of the IC package 100 are pulsed to control the latches to store the address inputs from the shared address input pins of IC package 100 as the program/erase address to be used by the first circuit to write to the first flash memory.

The addresses are latched before the time indicated by dashed line 700. At this time, the address provided at the shared input pins XADR[0] to XADR[9] and YADR[0 ] to YADR[4] is provided to the second circuit 106 to be used to read from the second flash memory 107.

In FIG. 8, when the time indicated by line 700 is reached, the signal XE (or the external input pins XEA and XEB) transitions from low to high, and the signal PROG (or the external input pins PROGA and PROGB) transitions from low to high. Then the signal NVSTR (or the external input pins NVSTRA and NVSTRB) transitions from low to high. By reference to FIG. 3, the combinations of operations for which XE, PROG and NVSTR are all high include programming first circuit A (104) either with no operation in second circuit B (106) or with a read operation in circuit 106. Between the times indicated by lines 800 and 802, YE transitions from low to high, and the first circuit 104 begins to program the memory cell at the address stored in the latches 118a, 118b.

FIG. 9 is an expanded detailed view of the time period between lines 800 and 802 of FIG. 8. The sense enable signal SE transitions from low to high to perform the read operation from the second flash memory 107.

This demonstrates the capability to perform concurrent programming and read operations at respectively different addresses in the first and second flash memories 105, 107, respectively. A similar set of signals and timing is used for concurrent erase and read operations, except that the ERASE signal would be asserted instead of the PROG signal. YE would be same as XE for erase.

The 'Read-read' combination can work with individual control pads easily. The common address pin input is toggled to both circuits 104, 106 at respectively different time slots to provide different addresses using the shared address input pin(s). In the case where both circuits 104, 106 are to access respective memory cells at the same address, then a respective set of signals XE, YE and SE are provided for each of the first circuit 104 reading from flash memory 105 and for the second circuit 106 reading from the second flash memory 107.

A control signal CONCUR is used for 'program-read' and 'erase-read' use. If the concurrent flag CONCUR is set, the first circuit 104 uses the latched address (X_CONCUR and Y_CONCUR); in other cases circuit 104 uses the common address (XADR_AB and YADR_AB) input from the external address input pins.

For the 'Program-read' and 'erase-read' combinations, since read time (on the order of ns)<<program time (on the order of microseconds)<<erase time (on the order of milliseconds). One can treat the program and erase address as a constant in first circuit 104 throughout the time second circuit 106 is performing a read. Therefore a latch 118a, 118b can be used to store the programmed/erased addressees for first circuit 104 for program-read and erase-read concurrent operations. Thus, one can use the latches 118a, 118b to pre-store the address of one circuit 104 to be programmed/erased, then use the externally provided addressees from the address input pins to read another circuit 106. Only performing a read in the second circuit 106 while the first circuit 104 is erasing or programming ensures that the read (of flash memory 107) can be performed completely within the time span of the erase or program operation in flash memory 105.

In the example above, the latches 118a, 118b are used to store the address for the relatively long program or erase operation in the first circuit 104. The second circuit 106, which performs the relatively short read operation in all three concurrent operations, uses the address currently provided at the address input pins. This allows a single latch to be used for the long program or erase operation, while a series of consecutive addresses are input from the external address input pins, and a corresponding series of short read operations are performed by the second circuit 106.

In other embodiments, a plurality of latches are provided to store a series of read addresses for the first circuit 104. Then first circuit 104 can perform a series of read operations while the second circuit 106 performs a program or erase operation.

Figure 10:
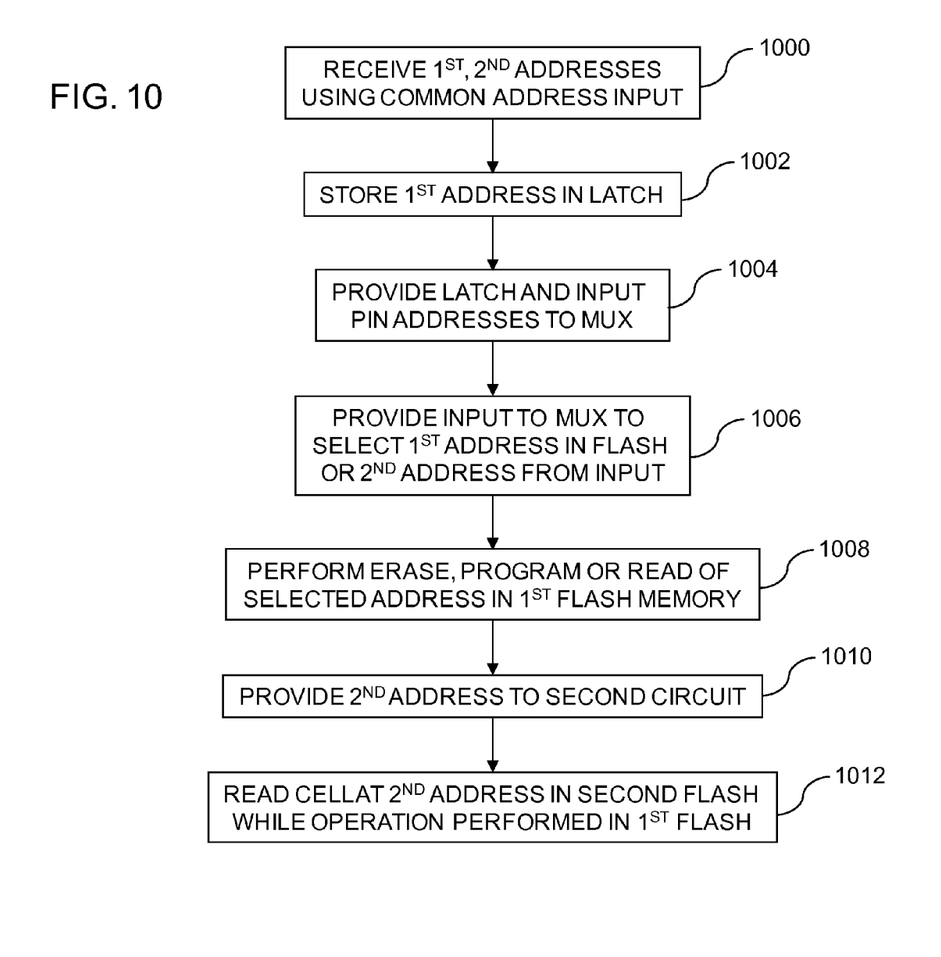
FIG. 10 is a flow chart of a method of using the system of FIG. 1A or 1B.

FIG. 10 is a flow chart of a method of using the system of FIG. 1A or 1B.

At step 1000, the IC 100 (100') receives a first address and a second address using an address input of the integrated circuit (IC) package having a first circuit 104 contained therein, the first circuit having a first flash memory 105.

At step 1002, the first address is stored in a storage device 118a, 118b inside the IC package 100 before receiving the second address. Both the first and second addresses are initially received from an external source by way of the shared common address input pin(s).

At step 1004, the first address from the storage device 118a, 118b is provided to a first input of a multiplexer 122a, 122b. The second address is provided directly from the address input to a second input of the multiplexer 122a, 122b.

At step 1006, a control signal is provided to the multiplexer 122a, 122b to select one of the group consisting of the first address and the second address. The step of selecting includes selecting the first address from the storage device or the second address from the address input. The selected address is output from the multiplexer.

At step 1008, the first circuit 104 performs a first operation from the group consisting of read, program and erase on a cell of the first flash memory 105 corresponding to the selected address.

At step 1010, the second address is provided to a second circuit 106 in the IC package 100 having a second flash memory 107.

At step 1012, the second circuit 106 reads a cell of the second flash memory 107 corresponding to the second address while the first operation is being performed. The reading step includes applying the second address to an address input of the second flash memory 107 while applying the first address to an address input of the first flash memory 105, where the second address is different from the first address, and the first address and the second address are sequentially received via the same address input of the IC package.

In some embodiments, the read operations are performed from both circuits 104, 106 concurrently. The address to be read from the first flash memory 105 is pre-stored into latches 118a, 118b, and the address to be read from the second flash memory is received by the external address input pad. There is only a small delay (e.g., about 3 nanoseconds) to store the first address in the latch 118a, 118b.

In other embodiments, to have concurrent read-read from the first and second circuits 104, 106 without time penalty, the IC package is provided with separate address input pads for each circuit. Then the CONCUR input pad is only used for concurrent program-read and concurrent erase-read combinations. This permits concurrent read-read from both circuits without any time penalty.

In some embodiments, a device comprises an address storage device. A first circuit includes a first flash memory, configured to sequentially receive first and second addresses and store the first address in the address storage device. The first circuit has a first set of control inputs for causing the first circuit to perform a first operation from the group consisting of read, program and erase on a cell of the first flash memory corresponding to a selected one of the first and second addresses. A second circuit includes a second flash memory, configured to receive the second address. The second circuit has a second set of control inputs for causing the second circuit to read data from a cell of the second flash memory corresponding to the second address while the first operation is being performed.

In some embodiments, a device comprises a first circuit including a first flash memory and a charge pump that provides a high voltage signal to the first flash memory. The first circuit has a first set of control inputs for causing the first circuit to perform an erase, program or read operation to the first flash memory. A second circuit includes a second flash memory. The second flash memory is configured without a charge pump. The second flash memory is connected to use the high voltage signal from the charge pump of the first circuit. The second circuit has a second set of control inputs independent from the first set of control inputs for causing the second circuit to read from the second flash memory while the erase, program or read operation is being performed.

In some embodiments, a method comprises receiving a first address and a second address using an address input of an integrated circuit (IC) package having a first circuit contained therein, the first circuit having a first flash memory. One of the group consisting of the first address and the second address is selected. A first operation is performed from the group consisting of read, program and erase on a cell of the first flash memory corresponding to the selected address. The second address is provided to a second circuit in the IC package having a second flash memory. A cell of the second flash memory corresponding to the second address is read while the first operation is being performed.

Although the subject matter has been described in terms of exemplary embodiments, it is not limited thereto. Rather, the appended claims should be construed broadly, to include other variants and embodiments, which may be made by those skilled in the art.

What is claimed is:

1. A device comprising:
   a first circuit including a first memory and a charge pump that provides a signal used by the first memory, the first circuit configured to perform an erase, program or read operation to the first memory; and
   a second circuit including a second memory, the second memory being configured without a charge pump, the second memory connected to use the signal from the charge pump of the first circuit, the second circuit configured to read from the second memory while the erase, program or read operation is being performed.

2. The device of claim 1, wherein the first and second memories are flash memories.

3. The device of claim 1, wherein the first circuit has a first set of control inputs, and the second circuit has a second set of control inputs independent from the first set of control inputs.

4. The device of claim 1, wherein charge pump is configured to output a high voltage signal.

5. The device of claim 1, wherein:
   the first and second circuits are formed on a single integrated circuit chip, and the first and second circuits are configured for operating concurrently on separate data streams.

6. The device of claim 1, further comprising:
at least one common address input pin, wherein at least one first address of a memory cell to be accessed in the first memory and at least one second address of a memory cell to be accessed in the second memory are both received via the at least one common address input pin.

7. The device of claim 1, further comprising a first conductive path for providing an erase voltage or a program voltage from the first circuit to the second circuit, and a second conductive path for providing a reference current from the first circuit to the second circuit.

8. A device comprising:
a first circuit including a first memory, the first circuit configured to receive first and second addresses and store the first address in an address storage device, the first circuit configured to perform a first operation from the group consisting of read, program and erase on a cell of the first memory corresponding to a selected one of the first and second addresses;
a second circuit including a second memory, the second circuit configured to receive the second address, the second circuit configured to read data from a cell of the second memory corresponding to the second address while the first operation is being performed.

9. The device of claim 8, wherein the first and second memories are flash memories.

10. The device of claim 8, wherein the first circuit has a first set of control inputs, and the second circuit has a second set of control inputs independent from the first set of control inputs.

11. The device of claim 8, wherein:
the first circuit has a charge pump configured to output a high voltage signal used by the first circuit,
the second circuit is configured without a charge pump and uses the high voltage signal output by the charge pump of the first circuit.

12. The device of claim 8, wherein:
the first and second circuits are formed on a single integrated circuit chip, and
the first and second circuits are configured for operating concurrently on separate data streams.

13. The device of claim 8, further comprising:
at least one common address input pin, wherein at least one first address of a memory cell to be accessed in the first memory and at least one second address of a memory cell to be accessed in the second memory are both received via the at least one common address input pin.

14. The device of claim 13, further comprising:
a multiplexer coupled to the at least one common address input pin for receiving the second address and to the address storage device for receiving the first address,
wherein the address storage device is coupled to receive the first address from the at least one common address input pin, and the multiplexer is responsive to a selection control input for outputting the first address or the second address as the selected one of the first and second addresses.

15. A method comprising:
providing a reusable design comprising a first circuit having a first flash memory and a charge pump in an IP library;
offering the reusable design comprising the first circuit to a customer of a foundry, for incorporation in an IC design of the customer;
receiving, from the customer, a design of a second circuit having a second flash memory without a charge pump, wherein the second circuit is configured to receive a voltage signal from the charge pump of the first circuit; and
fabricating an integrated circuit (IC) or 3DIC including the first and second circuits.

16. The method of claim 15, wherein the fabricating step includes:
forming a first IC including the first circuit,
forming a second IC including the second circuit; and
packaging the first and second ICs in a 3DIC package.

17. The method of claim 16, further comprising:
forming a through substrate via for providing the voltage signal from the charge pump of the first circuit to the second circuit.

18. The method of claim 16, further comprising:
forming a first through substrate via (TSV) for providing a high voltage signal from the charge pump of the first circuit to the second circuit;
forming a second TSV for providing an erase voltage or program voltage from the first circuit to the second circuit; and
forming a third TSV for providing a high reference current from the first circuit to the second circuit.

19. The method of claim 18, wherein the first, second and third TSVs are coupled to the second flash memory.

20. The method of claim 15, wherein the fabricating step includes:
providing the first circuit with a first set of control inputs for causing the first circuit to perform an erase, program or read operation to the first flash memory; and
providing the second circuit with a second set of control inputs independent from the first set of control inputs for causing the second circuit to read from the second flash memory while the erase, program or read operation is being performed.

* * * * *